(12) United States Patent
Lee et al.

(10) Patent No.: US 8,284,885 B2
(45) Date of Patent: Oct. 9, 2012

(54) CLOCK AND DATA RECOVERY CIRCUITS

(75) Inventors: Jr-I Lee, Taipei (TW); Ke-Chung Wu, Taipei (TW)

(73) Assignee: National Taiwan University, Taipei (TW)

(*) Notice: Subject to any disclaimer, the term of this patent is extended or adjusted under 35 U.S.C. 154(b) by 436 days.

(21) Appl. No.: 12/572,173

(22) Filed: Oct. 1, 2009

(65) Prior Publication Data

US 2010/0264967 A1   Oct. 21, 2010

(30) Foreign Application Priority Data

Apr. 17, 2009 (TW) ................................. 98112775 A

(51) Int. Cl.
*H03L 7/06* (2006.01)
(52) U.S. Cl. .................... 375/373; 327/158; 327/156
(58) Field of Classification Search .............. 375/376, 375/375, 373; 327/156, 3, 2, 158; 331/11, 331/12, 17, 25, 176, 177 R
See application file for complete search history.

(56) References Cited

U.S. PATENT DOCUMENTS

| 5,399,995 | A* | 3/1995 | Kardontchik et al. ......... 331/17 |
| 5,566,204 | A* | 10/1996 | Kardontchik et al. ........ 375/219 |
| 2005/0017774 | A1* | 1/2005 | Chow et al. .................... 327/156 |
| 2006/0044021 | A1* | 3/2006 | Wang ............................... 327/2 |
| 2008/0267335 | A1* | 10/2008 | Liu et al. ....................... 375/376 |

OTHER PUBLICATIONS

Seema Butala Anand and Behzad Razavi, "A CMOS Clock Recovery Circuit for 2.5-Gb/s NRZ Data", University of California, Mar. 2001, IEEE.*
Jri Lee and Mingchung Liu, "A 20-Gb/s Burst-Mode Clock and Data Recovery Circuit Using Injection-Locking Technique", National Taiwan University, Mar. 2008, IEEE.*
Jri Lee, Ke-Chung Wu, "A 20Gb/s Full-Rate Linear CDR Circuit with Automatic Frequency Acquisition", National Taiwan University, Taipei, Taiwan, Feb. 2009, IEEE.*
Jri Lee, Ke-Chung Wu, "A 20-Gb/s Full-Rate Linear Clock and Data Recovery Circuit With Automatic Frequency Acquisition", National Taiwan University, Taipei, Taiwan, Dec. 2009, IEEE.*
Daniel Abramovitch, "Phase-Locked Loops: A Control Centric Tutorial", Agilent Laboratories, Jun. 24, 2003.*

* cited by examiner

*Primary Examiner* — Aristocratis Fotakis
(74) *Attorney, Agent, or Firm* — CKC & Partners Co., Ltd.

(57) ABSTRACT

A clock and data recovery (CDR) circuit is provided. The CDR circuit receives a data signal and generates a clock signal. The CDR circuit comprises an oscillator, a phase detector, and a first voltage-to-current (V-to-I) converter. The oscillator generates the clock signal according to an oscillation voltage. The phase detector receives the data signal. The phase detector comprises a mixer for detecting a phase difference between the data clock and the clock signal and generating a phase detection signal which represents the phase difference. The first V-to-I converter receives the phase detection signal and generates a first current signal according to a voltage level of the phase detection signal to vary the oscillation voltage.

18 Claims, 6 Drawing Sheets

CLOCK AND DATA RECOVERY CIRCUITS

CROSS REFERENCE TO RELATED APPLICATIONS

This application claims the benefit of Taiwan application Serial No. 98112775 filed Apr. 17, 2009, the subject matter of which is incorporated herein by reference.

BACKGROUND OF THE INVENTION

1. Field of the Invention

The invention relates to a clock and data recovery circuit, and more particularly to a clock and data recovery circuit operating at full rate.

2. Description of the Related Art

Generally, compared to a binary clock and data recovery (CDR) circuit, it is easier to analyze and design a linear CDR clock. Moreover, a linear CDR circuit has better performance when considering output phase noise (i.e. less phase noise) and jitter. A conventional linear CDR circuit usually uses a flipflop-based phase detector. However, the flipflop-based phase detector cannot operate at a high rate due to its finite CK-to-Q delay and the time for pulse width comparison.

Recently, with increased electronic device operating rates, CDR circuits are being designed in parallel structures. However, parallel structure designed CDR circuits require additional clock signals. Moreover, parallel structure designed CDR circuits require operation at a half rate or a quarter rate, thus having poorer phase noise performance (i.e. greater phase noise) when compared a CDR circuit operating at a full rate.

Thus, it is desired to provide a CDR circuit which has a linear characteristic and can operate at a high rate.

BRIEF SUMMARY OF THE INVENTION

An exemplary embodiment of a clock and data recovery (CDR) circuit is provided. The CDR circuit receives a data signal and generates a clock signal. The CDR circuit comprises an oscillator, a phase detector, and a first voltage-to-current (V-to-I) converter. The oscillator generates the clock signal according to an oscillation voltage. The phase detector receives the data signal. The phase detector comprises a mixer for detecting a phase difference between the data clock and the clock signal and generating a phase detection signal which represents the phase difference. The first V-to-I converter receives the phase detection signal and generates a first current signal according to a voltage level of the phase detection signal to vary the oscillation voltage.

In some embodiments, the phase detector comprises a delay chain and a logic gate. The delay chain receives the data signal and delays the data signal to generate a final delayed data signal. The logic gate performs a logic operation to the data signal and the final delayed data signal to generate an operation result signal which represents transition of a level of the data signal. The mixer mixes the operation result signal and the clock signal to generate the phase detection signal, and a pulse width of the phase detection signal is directly proportional to the phase difference.

In some embodiments, the phase detector delays the data signal to generate a first delayed data signal and a second delayed data signal. The CDR circuit further comprises a frequency detector and a second V-to-I converter. The frequency detector is coupled to the phase detector. The frequency detector detects a frequency difference between the data signal and the clock signal according to the clock signal, the first delayed data signal, and the second delayed data signal and generates a frequency detection signal which represents the frequency difference. The second V-to-I converter receives the frequency detection signal and generates a second current signal according to a voltage of frequency detection signal to vary the oscillation voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
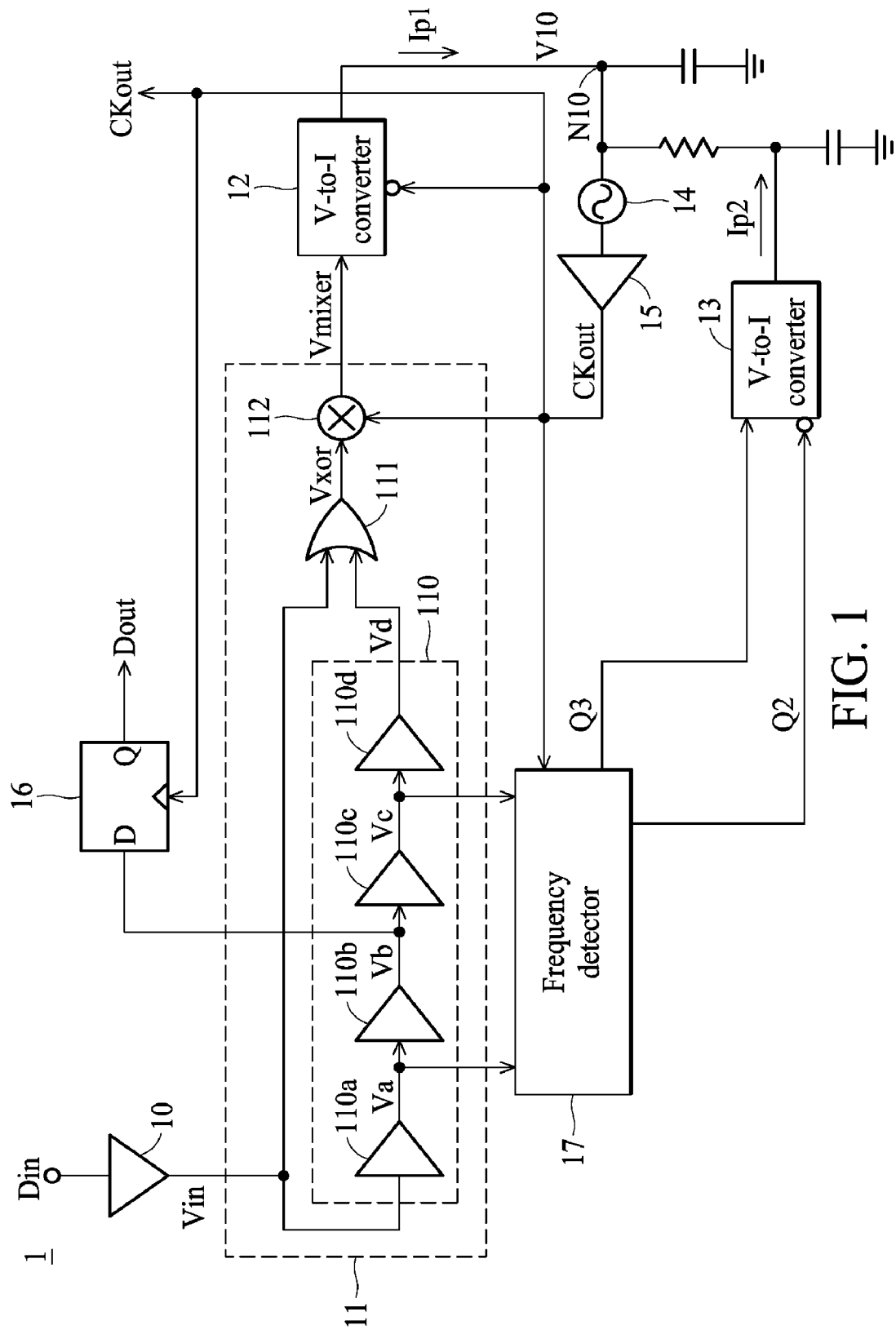
FIG. 1 shows an exemplary embodiment of a clock and data recovery (CDR) circuit.

The following description is of the best-contemplated mode of carrying out the invention. This description is made for the purpose of illustrating the general principles of the invention and should not be taken in a limiting sense. The scope of the invention is best determined by reference to the appended claims.

Clock and data recovery (CDR) circuits are provided. In an exemplary embodiment of a CDR circuit in FIG. 1, a CDR circuit 1 receives a data signal Din and generates a data recovery signal Dout and a clock signal CKout. The CDR circuit 1 comprises an input buffer 10, a phase detector 11, voltage-to-current (V-to-I) converters 12 13, an oscillator 14, a clock buffer 15, a flipflop 16, and a frequency detector 17. In the embodiment, the oscillator 14 is implemented by a voltage-controlled oscillator. The voltage-controlled oscillator 14 generates the clock signal CKout according to an oscillation voltage V10 at a node N10. The clock signal CKout is output to the phase detector 11, the V-to-I converter 12, the flipflop 16, and the frequency detection 17 via the clock buffer 15.

Figure 2:
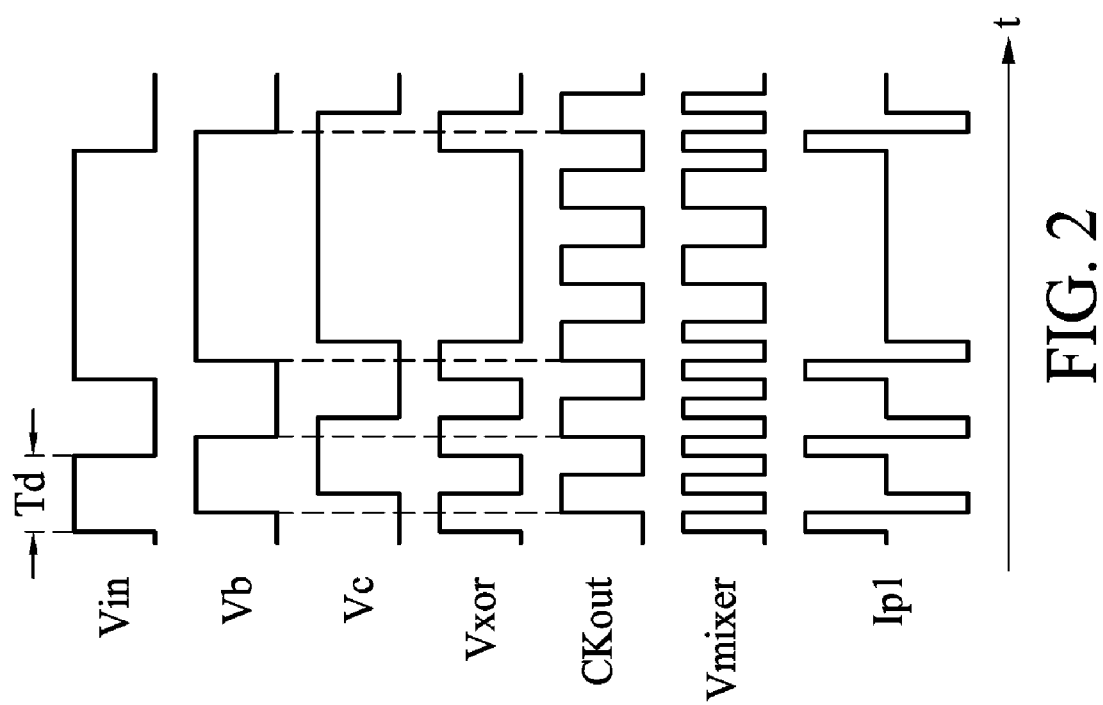
FIG. 2 shows waveforms of signals of the CDR circuit in FIG. 1.

In the embodiment, phase locking is performed by the phase detector 11 and the V-to-I converter 12. Referring to FIG. 1, the phase detector 11 comprises a delay chain 110, a logic gate 111, and a mixer 112. The delay chain 110 comprises a plurality of delay units 110a-110d coupled in series. The data signal Din is transmitted to the buffer 10, and the buffer 10 buffers the data signal Din to generate a buffered data signal Vin to the delay chain 110 and the logic gate 111. The buffer 10 is used to enhance the data signal Din In the embodiment, and the present invention is not limited to use the buffer 10. In some embodiments, the buffer 10 can be omitted. Thus, the data signal Din is directly transmitted to the delay chain 110 and the logic gate 111. The delay units 110a-110d respectively generate delayed data signals Va, Vb, Vc, and Vd by using delay operations provided from the delay units 110a-110d. Referring to FIG. 2, the phase difference between the last delayed data signal Vd and the buffered data signal Vin is equal to half of the data period Td of the data signal Din. In the embodiment, the delay units 110a-110d perform the delay operations with the same delay time. In other words, each of the delay units 110a-110d delays their respective input signal by one eighth of the data period Td to generate a respective output signal. For example, the delay unit 110a receives the buffered data signal Vin and delays the buffered data signal Vin by one eighth of the data period Td to generate the delayed data signal Va, and the delay unit 110b receives the delayed data signal Va and delays the delayed data signal Va by one eighth of the data period Td to generate the delayed data signal Vc, and so on, for the delay units 110c and 110d.

In the the embodiment, the logic gate 111 is implemented by an XOR gate. The logic gate 111 receives the buffered data signal Vin and the last delayed data signal Vd and performs an XOR logic operation to the signals to generate an operation result signal Vxor. Referring to FIG. 2, when phase transition (from a high level to a low level and from the low level to the high level) occurs for the buffered data signal Vin, the operation result signal Vxor is switched from a low level to a high level. When phase transition occurs for the final delayed data signal Vd, the operation result signal Vxor is switched from the high level to the low level. Thus, the level variation of the data signal Din is obtained, and the phase difference between the last delayed data signal Vd and the buffered data signal Vin is also obtained, according the operation result signal Vxor.

The mixer 12 receives the operation result signal Vxor and the clock signal CKout and mixes the operation result signal Vxor and an inverse signal of the clock signal CKout. For circuit equivalence, the mixer 112 is a multiplier which multiplies the operation result signal Vxor and the inverse signal of the clock signal CKout to generate a phase detection signal Vmixer. Referring to FIG. 2, the phase detection signal Vmixer represents the phase difference between the buffered data signal Vin and the clock signal CKout. In detail, the pulse width of the phase detection signal Vmixer is directly proportional to the phase difference between the buffered data signal Vin and the clock signal CKout.

The V-to-I converter 12 receives the phase detection signal Vmixer and varies the oscillation voltage V10 at the node N10 according to the voltage level of the phase detection signal Vmixer. The oscillator 14 varies the frequency of the clock signal CKout according to the variation of the oscillation voltage V10. The clock signal CKout is then output via the clock buffer 15.

According to the operation of the phase detector 11 and the V-to-I converter 12, the oscillation voltage V10 at the node N10 is varied according to the phase difference between the buffered data signal Vin and the clock signal CKout, and the oscillator 14 varies the frequency of the clock signal CKout according to the variation of the oscillation voltage V10. Accordingly, finally, the phase of the clock signal CKout is adjusted to be identical to the phase of the buffered data signal Vin.

As shown in FIG. 1, the clock signal CKout generated by the oscillator 14 is transmitted to the flipflop 16. The flipflop 16 receives the delayed data signal Vb and samples the delayed data signal Vb by the falling edge of the clock signal CKout to generate the data recovery signal Dout. Referring to FIG. 2, the phase difference between the delayed data signal Vb and the clock signal CKout is a quarter of the data period Td. When the clock signal CKout is locked, the falling edge of the clock signal CKout aligns with the center of the data period of the delayed data signal Vb. Thus, a perfect data recovery signal Dout is obtained by sampling the delayed data signal Vb according to the falling edge of the clock signal CKout.

For a tri-state characteristic of the data signal Din, when the data signal Din is continuously at the same level, the average output of the phase detector 11 has to be equal to zero to avoid jitters affecting the phase detection loop. That is, the duty cycle of the phase detection signal Vmixer has to be equal to 50%. Referring to FIG. 2, when the data signal Din is continuously at the same level, the phase detection signal Vmixer and the clock signal CKout are in phase. In this situation, if the duty cycle of the phase detection signal Vmixer is not equal to 50% due to circuitry mismatch, the average voltage level of the phase detection signal Vmixer generated by the mixer is not equal to zero. Accordingly, the V-to-I converter 12 generates a current Ip1 with a non-zero average, and the frequency of the clock signal CKout generated by the oscillator 14 is further varied, resulting in increased phase noise and undesired jitters. Thus, in some embodiments, the clock signal CKout generated by the oscillator 14 is further transmitted to the V-to-I converter 12. The V-to-I converter 12 performs an addition operation to the phase detection signal Vmixer and the inverse signal of the clock signal CKout and generates the current signal Ip1 according to the operation result. Referring FIG. 2, when the data signal Din is continuously at the same level, the phase detection signal Vmixer and the clock signal CKout are in phase. When the V-to-I converter 12 performs the addition operation to the phase detection signal Vmixer and the inverse signal of the clock signal CKout, the operation result is equal to zero. Thus, when the data signal Din is continuously at the same level, the phase detection signal Vmixer with the non-zero average voltage level is cancelled out by the addition operation result. At this time, the V-to-I converter 12 generates a current signal Ip1 with a zero average, so that the phase detection loop is not affected by undesired jitters.

Figure 3:
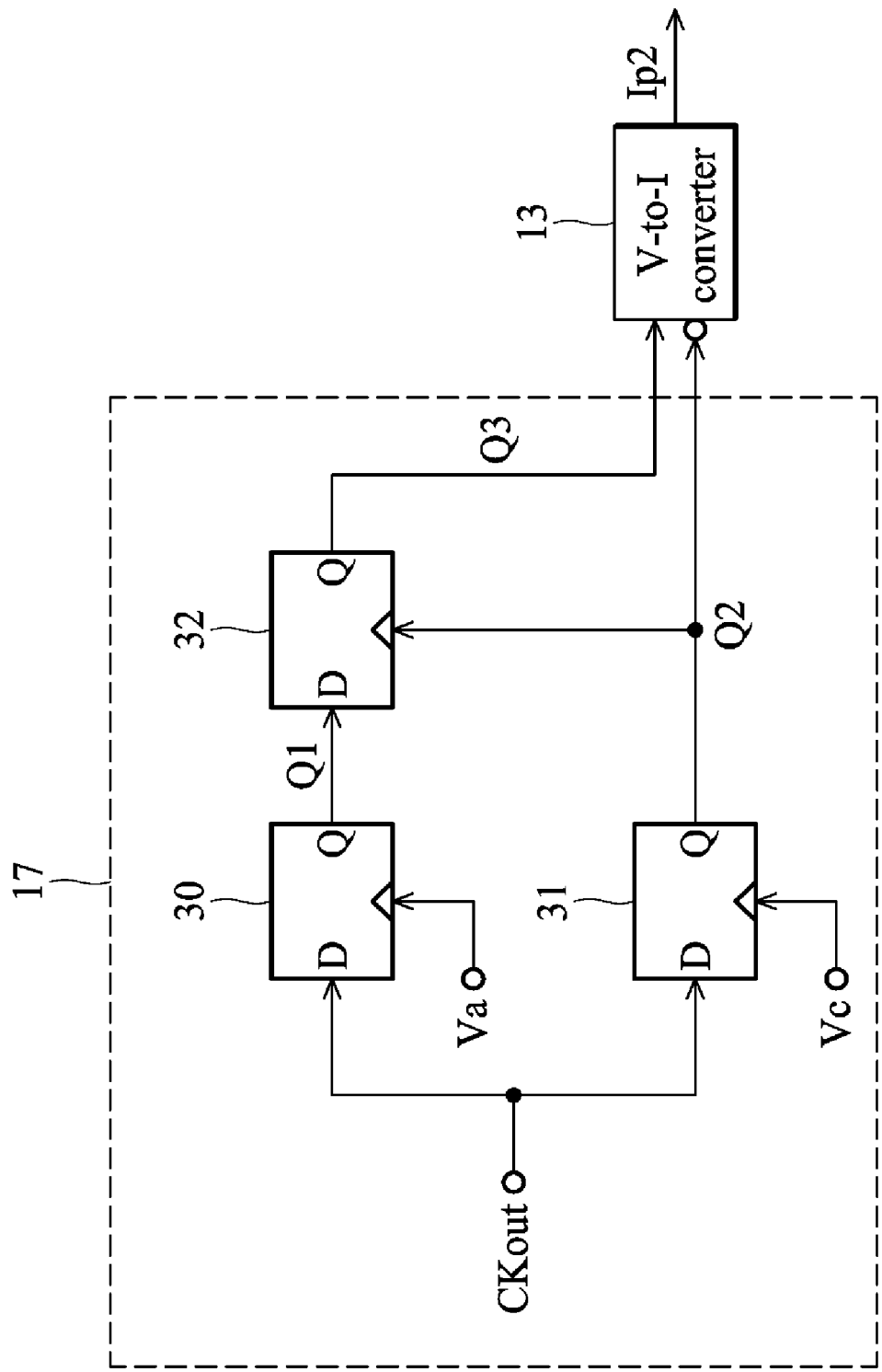
FIG. 3 shows an exemplary embodiment of the frequency detector in FIG. 1.

In the embodiment, frequency locking is performed by the frequency detector 17 and the V-to-I converter 13. FIG. 3 is an exemplary embodiment of the frequency detector 17 in FIG. 1. Referring to FIG. 3, the frequency detector 17 comprises flip-flops 30'32. The flipflop 30 receives the delayed data signal Va and the clock signal CKout and samples the clock signal CKout by the delayed data signal Va to generate a sampling signal Q1. The flipflop 31 receives the delayed data signal Vc and the clock signal CKout and samples the clock signal CKout by the delayed data signal Vc to generate a sampling signal Q2. The frequencies of the sampling signals Q1 and Q2 represent the frequency difference between the data signal Din and the clock signal CKout, while the phase relationship between the sampling signals Q1 and Q2 (leading or lagging) represents whether the frequency difference is positive or negative. In order to obtain the phase relationship between the sampling signals Q1 and Q2, the flipflop 32 samples the sampling signal Q1 by the falling edge of the sampling signal Q2 to generate a frequency detection signal Q3. The V-to-I converter 13 then generates a current signal Ip2 according to the voltage level of the frequency detection signal Q3 to vary the oscillation voltage V10. The oscillator 14 varies the frequency of the clock signal CKout according variation of the oscillation voltage V10 and outputs the clock signal CKout via the clock buffer 15. Accordingly, the frequency of the clock signal CKout is adjusted to finally be equal to the frequency of the data signal Din.

For example, when the frequency of the clock signal CKout is greater than the frequency of the data signal Din (i.e. the frequency difference is positive), the phase of the sampling signal Q2 leads the phase of the sampling signal Q1, so that the sampling signal Q3 is at a high logic level (i.e. "1"). At this time, the V-to-I converter 13 generates the current signal Ip2 according to the voltage level of the frequency detection signal Q3 to vary the oscillation voltage V10, and the oscillator 14 reduces the frequency of the clock signal CKout according to the variation of the oscillation voltage V10. Contrarily, when the frequency of the clock signal CKout is less than the frequency of the data signal Din (i.e. the frequency difference is negative), the phase of the sampling signal Q2 lags the phase of the sampling signal Q1, so that the sampling signal Q3 is at a low logic level (i.e. "0"). At this time, the V-to-I converter 13 generates the current signal Ip2 according to the voltage level of the frequency detection signal Q3 to vary the oscillation voltage V10, and the oscillator 14 increases the frequency of the clock signal CKout according to the variation of the oscillation voltage V10.

In some embodiments, the frequency locking performed by the frequency detector 17 and the V-to-I converter 13 can be turned on or turned off automatically. Referring to FIG. 3, an inverse signal of the sampling signal Q2 is provided to the V-to-I converter 13 to turn on or off the V-to-I converter 13. When frequency locking is being performed, since there is a frequency difference between the data signal Din and the clock signal CKout, the sampling signal Q2 is switched between a high logic level and a low lever ("1" and "0") for frequency adjustment of the clock signal CKout. When the frequency of the clock signal CKout is close to or equal to the frequency of the data signal Din, the sampling signal Q2 remains at the high logic level ("1"). Thus, the inverse signal of the sampling signal Q2 is at the low logic level ("0") to turn off the V-to-I converter 13, so that the frequency locking operation can automatically stop.

Figure 4B:
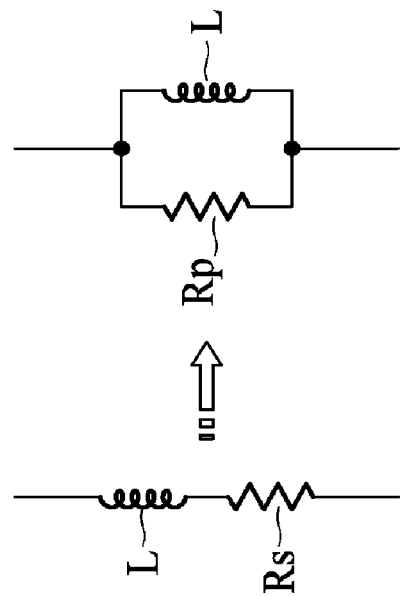
FIG. 4B shows an equivalent circuit of a parallel circuit for the set of the inductor and resistor in FIG. 4A.
Figure 4A:
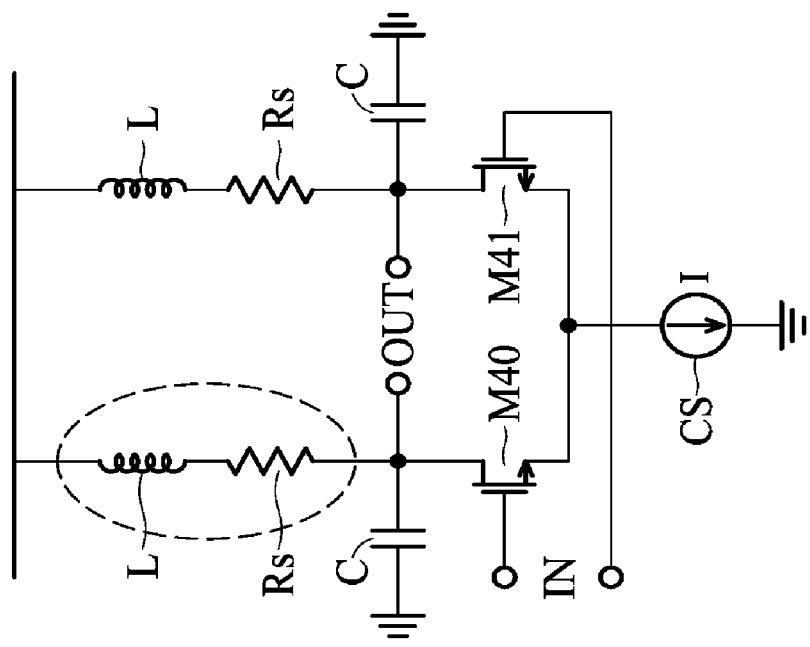
FIG. 4A shows an exemplary embodiment of the clock buffer in FIG. 1.

Referring to FIG. 1, the clock signal CKout output by the clock buffer 15 is transmitted to the phase detector 11, the V-to-I converter 12, the flipflop 15, and the frequency detector 17. The elements and the circuit lines therebetween result in very large parasitic capacitance. Thus, in some embodiments, the clock buffer 15 is designed with an under-damped structure to provide a stable and sufficiently large enough bandwidth. Referring to FIG. 4A, the clock buffer 15 comprises two inductors L, two resistors Rs, two capacitors C, two transistors M40 and M41, and a current source CS. The capacitors C represent the equivalent parasitic capacitance on the output terminal OUT of the clock buffer 15. Referring to FIG. 4A, one set of the inductor L and the resistor Rs are coupled in series. FIG. 4B shows one set of an inductor L and a resistor Rp coupled in parallel. The resistor Rp represents an equivalent resistance which is obtained by transforming the series circuit L-Rs to the parallel circuit L-Rp. The input terminal IN of the clock buffer 15 is coupled to the oscillator 14 to receive the clock signal CKout. The clock buffer 15 outputs the clock signal CKout by the output terminal OUT.

Figure 5:
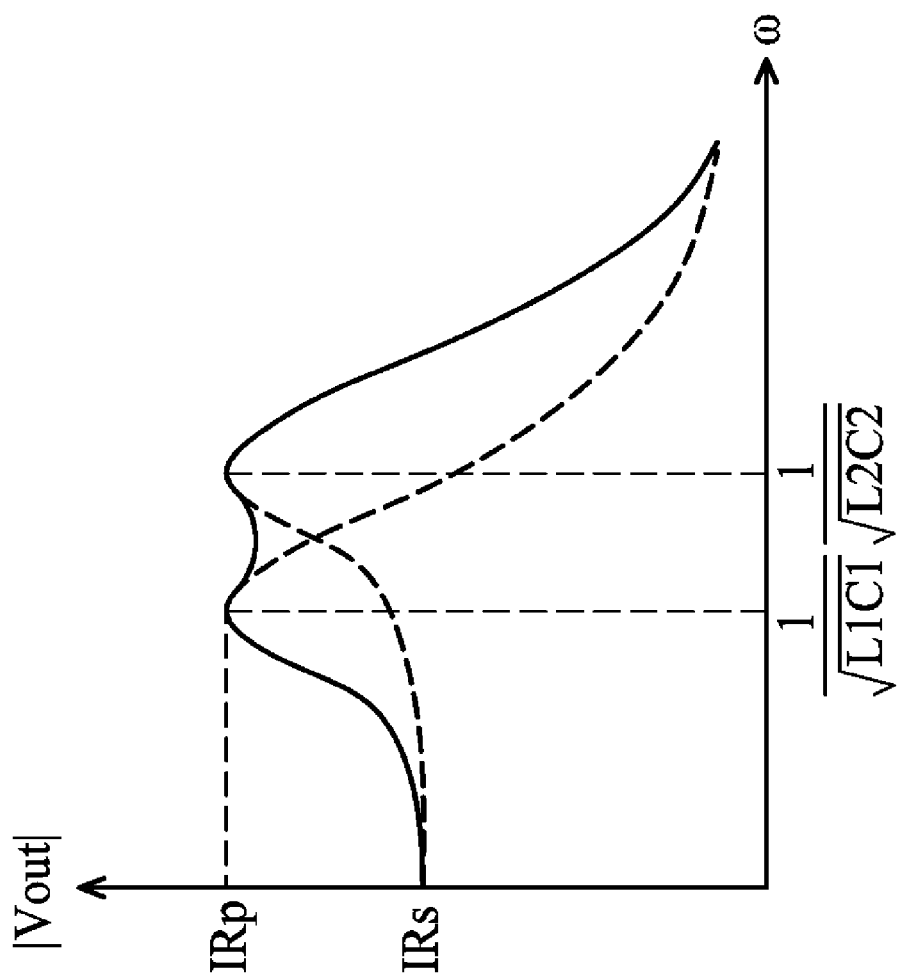
FIG. 5 shows an operation bandwidth of a multi-stage clock buffer.

In other some embodiments, buffer stages coupled in series can be used to increase the operation bandwidth of the clock buffer 15. Each buffer stage comprises the same circuit of FIG. 4A. Except for the last buffer stage, the output terminal OUT of each buffer stage is coupled to the input terminal IN of the next buffer stage. The buffer stages can operate in different bandwidths. As shown in FIG. 5, assume that the clock buffer 15 is composed of two buffer stages. The first buffer stage operates in the bandwidth of $$\frac{1}{\sqrt{L1C1}},$$

and the second buffer stage operates in the bandwidth of $$\frac{1}{\sqrt{L2C2}}.$$

As shown by the waveform in FIG. 5, the entire operation bandwidth of the clock buffer 15 is thus increased.

Figure 6:
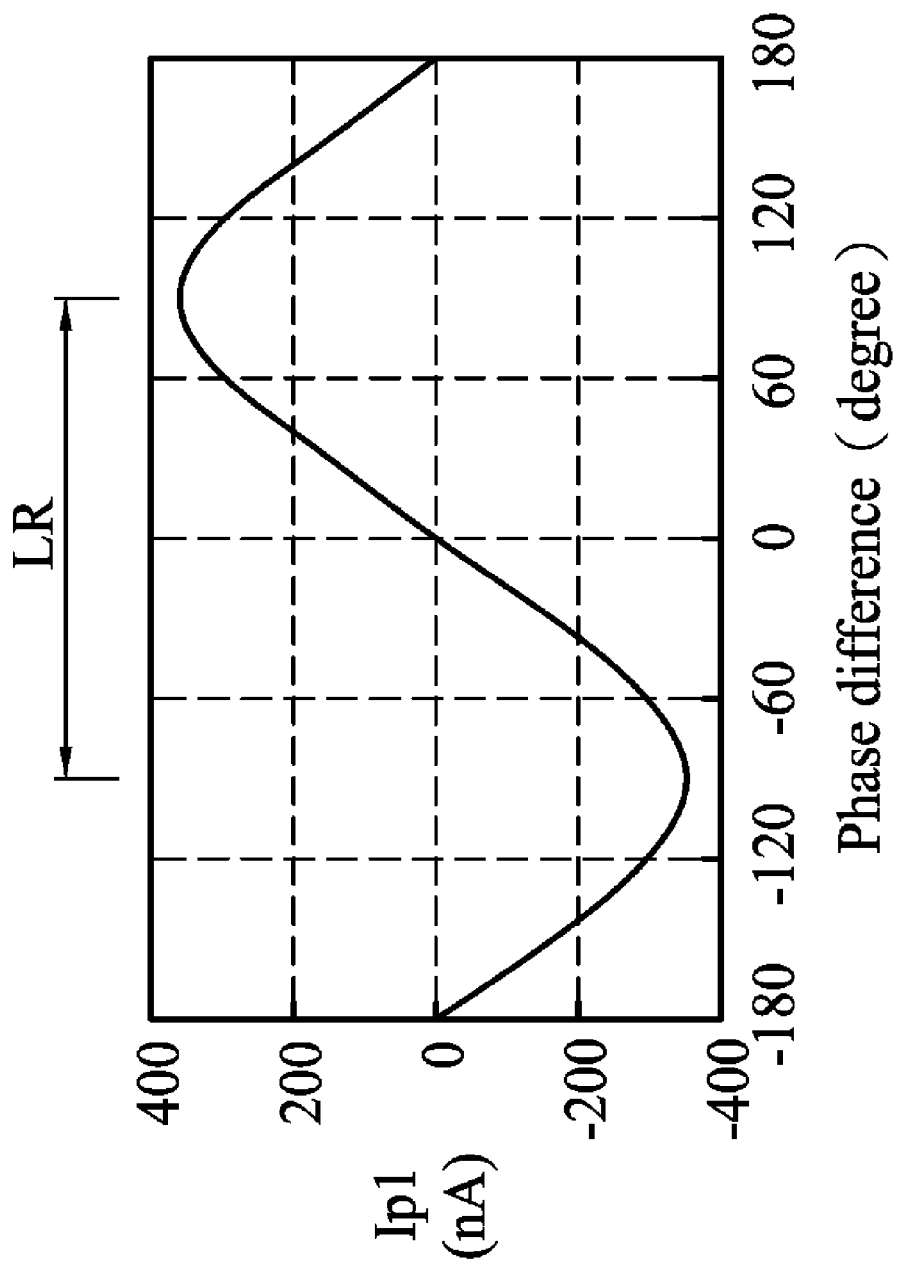
FIG. 6 shows a linear characteristic of the CDR circuit in FIG. 1.

As described above, the phase detector 11 of the embodiment uses the mixer 112 to perform the phase comparison not a flipflop. Thus, the phase detector 11 can operate at a high rate. FIG. 6 shows a simulate relationship between the current signal Ip1 of the V-to-I converter 12 and the phase difference between the data signal Din and the clock signal CKout. As shown in FIG. 6, the relationship has a large linear area LR. That is the phase locking performed by the phase detector 11 and the V-to-I converter 12 has good linear characteristics. Thus, the CDR circuit 1 of the embodiment has a linear characteristic and can operate at a high rate.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock and data recovery (CDR) circuit for receiving a data signal and generating a clock signal, comprising:
    an oscillator for generating the clock signal according to an oscillation voltage;
    a phase detector for receiving the data signal, wherein the phase detector comprises a mixer, the mixer configured for detecting a phase difference between the data signal and the clock signal and generating a phase detection signal which represents the phase difference between the data signal and the clock signal, wherein the phase detector delays the data signal to generate a first delayed data signal and a third delayed data signal;
    a first voltage-to-current (V-to-I) converter for receiving the phase detection signal and generating a first current signal according to a voltage level of the phase detection signal to vary the oscillation voltage;
    a frequency detector, coupled to the phase detector, for detecting a frequency difference between the data signal and the clock signal according to the clock signal, the first delayed data signal, and the third delayed data signal and generating a frequency detection signal which represents the frequency difference; and
    a second V-to-I converter for receiving the frequency detection signal and generating a second current signal according to a voltage of the frequency detection signal to vary the oscillation voltage.

2. The CDR circuit as claimed in claim 1, wherein the phase detector comprises:
    a delay chain for receiving the data signal and delaying the data signal to generate a final delayed data signal; and
    a logic gate for performing a logic operation to the data signal and the final delayed data signal to generate an operation result signal, wherein the operation result signal represents transition of a level of the data signal;
    wherein the mixer mixes the operation result signal and the clock signal to generate the phase detection signal, and a pulse width of the phase detection signal is directly proportional to the phase difference.

3. The CDR circuit as claimed in claim 2, wherein the logic gate is implemented by an XOR gate.

4. The CDR circuit as claimed in claim 2, wherein a phase between the final delayed data signal and the data signal is equal to a half of a data period of the data signal.

5. The CDR circuit as claimed in claim 2, wherein the delay chain comprises:
   a first delay unit for receiving the data signal and delaying the data signal by a predetermined time to generate the first delayed data signal;
   a second delay unit for receiving the first delayed data signal and delaying the first delayed data signal by the predetermined time to generate a second delayed data signal;
   a third delay unit for receiving the second delayed data signal and delaying the second delayed data signal by the predetermined time to generate a third delayed data signal; and
   a fourth delay unit for receiving the third delayed data signal and delaying the third delayed data signal by the predetermined time to generate the final delayed data signal.

6. The CDR circuit as claimed in claim 5, wherein the predetermined time is equal to one eighth of a data period of the data signal.

7. The CDR circuit as claimed in claim 5, further comprising a flipflop for receiving the second delayed data signal and sampling the second delayed data signal with the clock signal to generate a data recovery signal, wherein a phase difference between the second delayed data signal and the data signal is equal to quarter of a data period of the data signal.

8. The CDR circuit as claimed in claim 1, wherein the frequency detector comprises:
   a first flipflop for receiving the first delayed data signal and sampling the clock signal by the first delayed data signal to generate a first sampling signal;
   a second flipflop for receiving the third delayed data signal and sampling the clock signal by the third delayed data signal to generate a second sampling signal; and
   a third flipflop for receiving the first sampling signal and the second sampling signal and sampling the first sampling signal by the second sampling signal to generate the frequency detection signal,
   wherein the frequency detection signal represents whether a frequency of the clock signal is greater or less than a frequency of the data signal.

9. The CDR circuit as claimed in claim 8, wherein the second V-to-I converter is controlled by the second sampling signal, and when the frequency of the clock signal is close to the frequency of the data signal, the second sampling signal remains at a level to turn off the second V-to-I converter.

10. The CDR circuit as claimed in claim 1, further comprising a flipflop, wherein the phase detector delays the data signal to generate a second delayed data signal, and the flipflop sampling the second delayed data signal with the clock signal to generate a data recovery signal.

11. The CDR circuit as claimed in claim 10, wherein a phase difference between the second delayed data signal and the data signal is equal to a quarter of a data period of the data signal.

12. The CDR circuit as claimed in claim 1, wherein a phase difference between the first delayed data signal and the data signal is equal to one eighth of a data period of the data signal, and a phase difference between the third delayed data signal and the data signal is equal to three eighth of the data period of the data signal.

13. The CDR circuit as claimed in claim 1, wherein the frequency detector comprises:
   a first flipflop for receiving the first delayed data signal and sampling the clock signal by the first delayed data signal to generate a first sampling signal;
   a second flipflop for receiving the third delayed data signal and sampling the clock signal by the second delayed data signal to generate a second sampling signal; and
   a third flipflop for receiving the first sampling signal and the second sampling signal and sampling the first sampling signal by the second sampling signal to generate the frequency detection signal,
   wherein the frequency detection signal represents whether a frequency of the clock signal is greater or less than a frequency of the data signal.

14. The CDR circuit as claimed in claim 13, wherein the second V-to-I converter is controlled by the second sampling signal, and when the frequency of the clock signal is close to the frequency of the data signal, the second sampling signal remains at a level to turn off the second V-to-I converter.

15. The CDR circuit as claimed in claim 1, wherein the first V-to-I converter further comprises the clock signal, performs an addition operation to the phase detection signal and an inverse signal of the clock signal, and generates the first current signal according to the addition operation result.

16. The CDR circuit as claimed in claim 15, wherein when the data signal is continuously at the same level, the phase detection signal and the inverse signal of the clock signal are in phase, and an average of the first current signal which is generated by the first V-to-I converter according to the addition operation result is equal to zero.

17. The CDR circuit as claimed in claim 1 further comprising a clock buffer, coupled to the oscillator, for outputting the clock signal.

18. The CDR circuit as claimed in claim 17, wherein the clock buffer is implemented by an under-damped buffer.

* * * * *